(12) United States Patent
Lee

(10) Patent No.: US 10,134,932 B2
(45) Date of Patent: Nov. 20, 2018

(54) SOLAR CELL AND METHOD OF FABRICATING THE SAME

(71) Applicant: LG INNOTEK CO., LTD., Seoul (KR)

(72) Inventor: Ho Min Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 188 days.

(21) Appl. No.: 14/389,167

(22) PCT Filed: Mar. 27, 2013

(86) PCT No.: PCT/KR2013/002561
§ 371 (c)(1),
(2) Date: Sep. 29, 2014

(87) PCT Pub. No.: WO2013/147517
PCT Pub. Date: Oct. 3, 2013

(65) Prior Publication Data
US 2015/0083208 A1    Mar. 26, 2015

(30) Foreign Application Priority Data

Mar. 27, 2012   (KR) .................. 10-2012-0030969

(51) Int. Cl.
*H01L 31/0465*    (2014.01)
*H01L 31/0463*    (2014.01)
(52) U.S. Cl.
CPC ...... *H01L 31/0465* (2014.12); *H01L 31/0463* (2014.12); *Y02E 10/50* (2013.01)
(58) Field of Classification Search
CPC .............................................. H01L 31/0465
(Continued)

(56) References Cited

U.S. PATENT DOCUMENTS 4,879,251 A * 11/1989 Kruehler ........... H01L 31/03921
136/244
2006/0110860 A1* 5/2006 Geyer ................ H01L 31/0465
438/128

(Continued)

FOREIGN PATENT DOCUMENTS

CN        1933185 A    3/2007
JP        2012-023357 A    2/2012
(Continued)

OTHER PUBLICATIONS

International Search Report dated Jul. 9, 2013 issued in Application No. PCT/KR2013/002561.

(Continued)

*Primary Examiner* — Allison Bourke
(74) *Attorney, Agent, or Firm* — KED & Associates LLP

(57) ABSTRACT

A solar cell according to the embodiment includes a support substrate; a back electrode layer on the support substrate; a light absorbing layer on the back electrode layer; a buffer layer on the light absorbing layer; a front electrode layer on the buffer layer; a connecting member passing through the buffer layer to electrically connect the back electrode layer to the front electrode layer; and a side insulating part on one of side surfaces of the connecting member, wherein the side insulating part makes direct contact with a portion of the buffer layer, the back electrode layer and the light absorbing layer.

5 Claims, 2 Drawing Sheets

(58) Field of Classification Search
USPC .......................................................... 136/249
See application file for complete search history.

(56) References Cited

U.S. PATENT DOCUMENTS

| | | | |
|---|---|---|---|
| 2007/0200192 A1* | 8/2007 | Shinohara | H01L 31/076 257/448 |
| 2009/0229653 A1* | 9/2009 | Lu | H01L 31/022425 136/249 |
| 2010/0059100 A1 | 3/2010 | Kim et al. | 136/244 |
| 2011/0308588 A1* | 12/2011 | Nishi | H01L 31/03682 136/255 |
| 2012/0199191 A1 | 8/2012 | Lim | 136/256 |

FOREIGN PATENT DOCUMENTS

| | | |
|---|---|---|
| KR | 10-2010-0026710 A | 3/2010 |
| KR | 10-1000383 B1 | 12/2010 |
| KR | 10-2011-0047726 A | 5/2011 |
| WO | WO 2011/053007 A2 | 5/2011 |

OTHER PUBLICATIONS

Chinese Office Action for Application 201380023068.5 dated Dec. 21, 2015 (full Chinese text).
Chinese Office Action for Application 201380023068.5 dated Dec. 21, 2015 (full English translation).

* cited by examiner

SOLAR CELL AND METHOD OF FABRICATING THE SAME

CROSS-REFERENCE TO RELATED PATENT APPLICATIONS

This application is a U.S National Stage Application under 35 U.S.C. § 371 of PCT Application No. PCT/KR2013/002561, filed Mar. 27, 2013, which claims priority to Korean Patent Application No. 10-2012-0030969, filed Mar. 27, 2012, whose entire disclosures are hereby incorporated by reference.

TECHNICAL FIELD

The embodiment relates to a solar cell and a method of fabricating the same.

BACKGROUND ART

A solar cell apparatus for converting sunlight into electrical energy includes a solar cell panel, a diode, and a frame.

The solar cell panel has a plate shape. For example, the solar cell panel has a rectangular plate shape. The solar cell panel is disposed inside the frame. Four side surfaces of the solar cell panel are disposed inside the frame.

The solar cell panel receives sunlight, and converts the sunlight into electrical energy. The solar cell panel includes a plurality of solar cells. The solar cell panel may further include a substrate, a film, or protective glass for protecting the solar cells.

The solar cell panel includes bus bars connected to the solar cells. The bus bars extend from upper surface of outermost solar cells and are connected to wires, respectively.

The diode is connected to the solar cell panel in parallel. A current selectively flows through the diode. That is, when a performance of the solar cell panel deteriorates, a current flows through the diode. Accordingly, a short circuit of the solar cell apparatus is prevented. The solar cell apparatus may further include wires connected to the diode and the solar cell panel. The wires connect solar cell panels adjacent to each other.

The frame accommodates the solar cell panel therein. The frame is made of a metal. The frame is disposed on a side surface of the solar cell panel. The frame accommodates a side surface of the solar cell panel therein. The frame may include a plurality of sub-frames. In this case, the sub-frames may be connected to each other.

Such a solar cell apparatus is mounted in the outdoor field to convert sunlight into electrical energy. Thus, the solar cell apparatus may be exposed to the external physical impact, electric impact and chemical impact.

A technology related to such a solar cell apparatus is disclosed in Korean Unexamined Patent Publication No. 10-2009-0059529.

DISCLOSURE OF INVENTION

Technical Problem

The embodiment provides a solar cell having improved photoelectric conversion efficiency and preventing a short circuit, and a method of fabricating the same.

Solution to Problem

According to the embodiment, there is provided a solar cell including a support substrate; a back electrode layer on the support substrate; a light absorbing layer on the back electrode layer; a buffer layer on the light absorbing layer; a front electrode layer on the buffer layer; a connecting member passing through the buffer layer to electrically connect the back electrode layer to the front electrode layer; and a side insulating part on one of side surfaces of the connecting member, wherein the side insulating part makes direct contact with a portion of the buffer layer, the back electrode layer and the light absorbing layer.

According to the embodiment, there is provided a method of fabricating a solar cell. the method includes forming a back electrode layer on a substrate; forming a light absorbing layer on the back electrode layer; forming a buffer layer on the light absorbing layer; forming a through hole through the buffer layer, the light absorbing layer, and the back electrode layer; forming a side insulating part on a side surface of the through hole; and forming a connecting member and a front electrode layer on the buffer layer.

Advantageous Effects of Invention

The solar cell and the method of fabricating the same according to the embodiment can provide the side insulating part formed at the side surface of the first though hole or on the side surface of the connecting member 600 or.

Further, the solar cell and the method of fabricating the same according to the embodiment can separate the back electrode layer and connect the front electrode layer and the back electrode layer to each other through first through hole.

That is, different from the related art in which through holes for separating the back electrode layer and through holes for connecting the front electrode layer and the back electrode layer to each other are separately formed, the embodiment can reduce a dead zone area which may not work as a solar cell.

Therefore, the method of fabricating a solar cell according to the embodiment can simplify a process so that process efficiency and process cost can be reduced. Further, the dead zone area may be reduced so that the efficiency of the solar cell can be improved.

In addition, the back electrode layer and the front electrode layer can be short-circuited through the side insulating part, so that the amount of leakage current can be effectively reduced.

MODE FOR THE INVENTION

Figure 1:
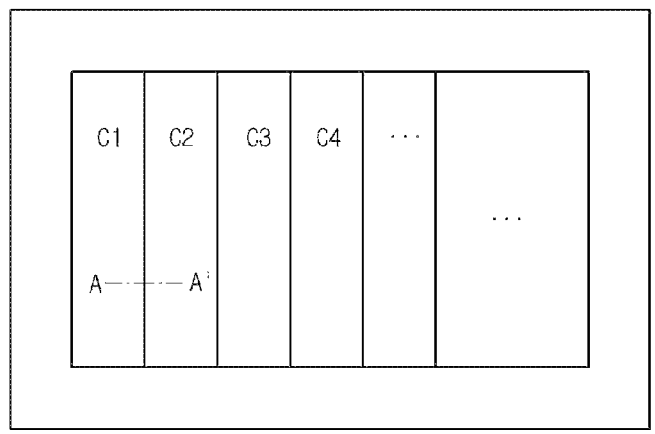
FIG. 1 is a plan view showing a solar cell according to the embodiment.

In the description of the embodiments, it will be understood that, when a panel, a bar, a frame, a substrate, a recess, or a film is referred to as being "on" or "under" another panel, bar, frame, substrate, recess, or film, it can be "directly" or "indirectly" on the other panel, bar, frame, substrate, recess, or film, or one or more intervening layers may also be present. Such a position of the element described with reference to the drawings. The thickness and size of each element shown in the drawings may be exaggerated, omitted or schematically drawn for the purpose of convenience or clarity. In addition, the size of elements does not utterly reflect an actual size.

Figure 2:
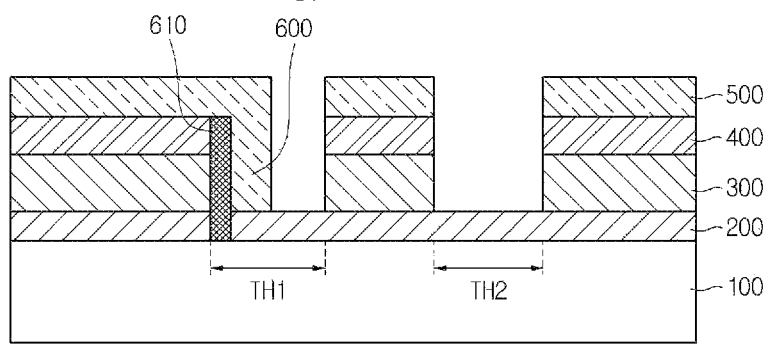
FIG. 2 is a sectional view taken long line A-A' of FIG. 1.

FIG. 1 is a plan view showing a solar cell according to the embodiment. FIG. 2 is a sectional view taken long line A-A' of FIG. 1.

Referring to FIGS. 1 and 2, the solar cell according to the embodiment includes a support substrate 100, a back electrode layer 200, a light absorbing layer 300, a buffer layer 400, a front electrode layer 500, a connecting member 600 and a side insulating part 610.

The support substrate 100 has a plate shape, and supports the back electrode layer 200, the light absorbing layer 300, the buffer layer 400, the front electrode layer 500, the connecting member 600 and the side insulating part 610.

The support substrate 100 may include an insulator. The support substrate 100 may be a glass substrate, a plastic substrate or a metal substrate. In more detail, the support substrate 100 may be a soda lime glass substrate. The support substrate 100 may be transparent. The support substrate 100 may be flexible or rigid.

The back electrode layer 200 is a conductive layer. The back electrode layer 200 is provided on the support substrate 100.

The back electrode layer 200 may include at least one of molybdenum (Mo), gold (Au), aluminum (Al), chrome (Cr), tungsten (W), and copper (Cu). Among the above materials, the Mo has a thermal expansion coefficient similar to that of the support substrate 100, so the Mo may improve the adhesive property and prevent the back electrode layer 200 from being delaminated from the substrate 100. That is, the characteristics required to the back electrode layer 200 may be satisfied overall by the Mo.

The light absorbing layer 300 is provided on the back electrode layer 200.

The light absorbing layer 300 includes a group I-III-VI compound. For example, the light absorbing layer 300 may have the CIGSS $(Cu(IN,Ga)(Se,S)_2)$ crystal structure, the CISS $(Cu(IN)(Se,S)_2)$ crystal structure or the CGSS $(Cu(Ga)(Se,S)_2)$ crystal structure. In addition, the light absorbing layer 300 may have an energy bandgap in the range of about 1 eV to about 1.8 eV.

The buffer layer 400 is disposed on the light absorbing layer 300. In the solar cell according to the embodiment, a pn junction is formed between the light absorbing layer 300 corresponding to a CIGS or CIGSS compound thin film which is a p-type semiconductor and a thin film of the front electrode layer 500 which is an n-type semiconductor. However, differences between lattice constants and band gap energy between the two materials are large, and thus a buffer layer by which a band gap is located between the two materials is necessary to form an excellent junction. The buffer layer 400 includes cadmium sulfide (CdS), and an energy band gap of the buffer layer 400 is approximately 2.2 eV to 2.4 eV.

Meanwhile, although not shown in the drawings, a high-resistance buffer layer may be additionally disposed on the buffer layer. The high-resistance buffer layer may include zinc oxide (i-ZnO) which is not doped with impurities. An energy band gap of the high-resistance buffer layer is approximately 3.1 eV to 3.3 eV.

First through holes TH1 may be formed in the buffer layer 400. The first through holes TH1 correspond to open areas for exposing upper surfaces of the support substrate 100 and the back electrode layer 200. When viewed from the top, the first through holes TH1 may extend in one direction. A width of the first through holes TH1 may be in the range of about 80 μm to about 200 μm, but the embodiment is not limited thereto.

The connecting member 600 and the side insulating part 610 are formed in the first though holes TH1 . This will be described in detail together with the connecting member 600 described below.

The front electrode layer 500 is disposed on the buffer layer 400. The front electrode layer 500 is transparent, and is a conductive layer. The front conductive layer 500 may include an oxide. For example, the front electrode layer 500 may include zinc oxide, indium tin oxide (ITO), or indium zinc oxide (IZO). The oxide may include conductive impurities such as aluminum (Al), alumina ($Al_2O_3$), magnesium (Mg), or gallium (Ga). In more detail, the front electrode layer 500 may include Al doped zinc oxide (AZO) or Ga doped zinc oxide (GZO).

The connecting member 600 is formed integrated with the front electrode layer 500. That is, the connecting member 600 may be formed at the same time as the front electrode layer 500. The material used as the connecting member 600 is the same as that of the front electrode layer 500.

The connecting member 600 is disposed in the first through holes TH1 . That is, the connecting member 600 extends through the light absorbing layer 300.

The connecting member 600 extends downward from the front electrode layer 500 and is connected to the back electrode layer 200. That is, the connecting member 600 may electrically connect the front electrode layer 500 and the back electrode layer 200 to each other.

For example, the connecting member 600 extends from a front electrode of a first cell C1, and is connected to a back electrode of a second cell C2 adjacent to the first cell C1. Thus, the connecting member 600 connects adjacent cells. In more detail, the connecting member 600 connects windows and back electrodes included in the adjacent cells C1, C2, . . . so that a current flows.

The side insulating part 610 may be formed on the open area of exposing the upper surface of the support substrate 100 in the first through holes TH1 . The side insulating part 610 may be disposed at a side surface of one of the connecting members 600. That is, the side insulating part 610 may be formed to make direct contact with the side surfaces of the back electrode layer 200, the light absorbing layer 300 and the buffer layer 400.

The side insulating part 610 is an area a resistance of which is higher than that of the connecting member 600, and may prevent electrons in the connecting member 600 from flowing to the light absorbing layer 300. Further, the side insulating part 610 may prevent the electrons in the connecting member 600 from flowing to the back electrode layer 200 in the opposite direction. That is, the solar cell according to the embodiment may reduce a leakage current through the side insulating part 610.

A material of the side insulating part 610 is not specially limited if the material has a higher resistance than that of the connecting member 600. In more detail, the side insulating part 610 may include a metallic oxide layer, an inorganic oxide layer or a polymer insulating layer. Further, a width of the side insulating part 610 may be in the range of about 1 μm to 10 μm, but the embodiment is not limited thereto.

The side insulating part 610 is gap-filled in the first through holes TH1 to be formed. That is, the side insulating part 610 is gap-filled in the first through holes TH1 to be formed together with the connecting member 600. For example, the side insulating part 610 may formed between side surfaces of the back electrode layer 200, the light absorbing layer 300 and the buffer layer 400 exposed through the first through holes TH1 and a side surface of the connecting member 600. Thus, the side insulating part 610 may make direct contact with a portion of the back electrode layer 200, that is, the side surface of the back electrode layer 200 exposed by the first through holes TH1

As described above, the embodiment provides the solar cell including the side insulating part 610 formed at the side surface of the first through hole TH1 or the side surface of the connecting member 600.

According to the solar cell of the embodiment, the back electrode layer 200 and the front electrode layer 500 may be connected to or separated from each other through the first though hole TH1.

That is, different from the related art in which through holes TH1 for separating the back electrode layer 200 and through holes TH1 for connecting the front electrode layer 500 and the back electrode layer 200 to each other are separately formed, the embodiment can reduce a dead zone area which may not work as a solar cell Therefore, the method of fabricating a solar cell according to the embodiment may simplify the process so that process efficiency may be improved and process cost may be reduced. Further, according to the embodiment, the dead zone may be reduced so that the efficiency of the solar cell may be improved.

Further, according to the embodiment, the back electrode layer and the front electrode layer may be effectively short-circuited to each other through the side insulating part and an amount of leakage current may be reduced.

FIGS. 3 to 7 are sectional views illustrating a method of fabricating a solar cell according to the embodiment. The method of fabricating a solar cell will be described with reference to the solar cell according to the embodiment described above.

Figure 3:
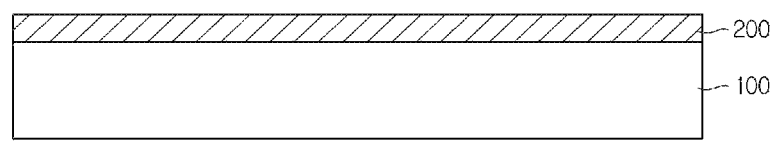
FIGS. 3 to 7 are sectional views illustrating a method of fabricating a solar cell according to the embodiment.

Referring to FIG. 3, the back electrode layer 200 is formed on the support substrate 100. The back electrode layer 200 may be formed through a physical vapor deposition scheme or a plating scheme.

Figure 4:
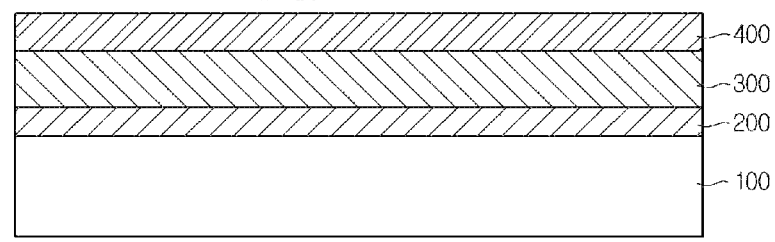

Referring to FIG. 4, the light absorbing layer 300 and the buffer layer 400 may be formed on the back electrode layer 200.

For example, in order to form the light absorbing layer 300, a method of forming a copper-indium-gallium-selenium-based ($Cu(In,Ga)(Se)_2$; CIGS-based) light absorbing layer 300 while simultaneously or separately evaporating copper, indium, gallium, and selenium and a method for performing a selenization process after a metallic precursor layer has been formed are widely used.

Regarding the details of the selenization process after the formation of the metallic precursor layer, the metallic precursor layer is formed on the back electrode layer 200 through a sputtering process employing a Cu target, an In target, and a Ga target. Thereafter, the metallic precursor layer is subject to the selenization process so that the $Cu(In,Ga)Se_2$ (GIGS) based light absorbing layer 300 is formed.

As an alternative, the sputter process and the selenization process using the copper target, the indium target, and the gallium target may be performed at the same time. As another alternative, a CIS-based or CIG-based light absorbing layer 300 may be formed through a sputtering process or a selenization process by using only a copper target or an indium target, or by using a copper target and a gallium target.

The buffer layer 400 may be formed by depositing CdS on the light absorbing layer 300 through a chemical bath deposition (CBD) scheme. Further, zinc oxide is deposited on the buffer layer 400 through the sputtering process, thereby forming the high resistance buffer layer 500.

Figure 5:
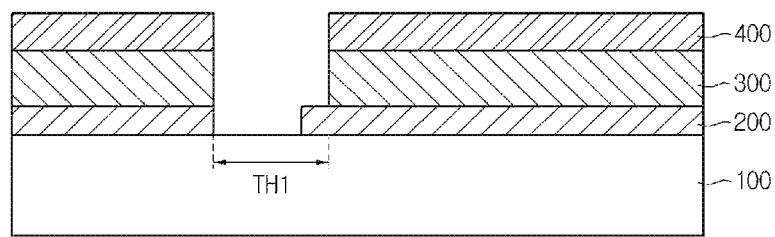
Figure 6:
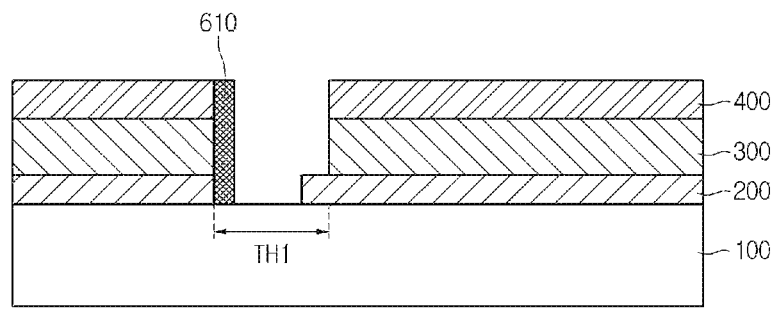
Figure 7:
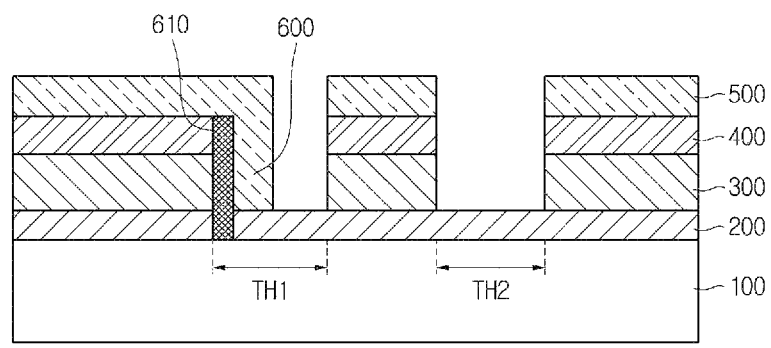

Referring to FIGS. 5 to 7, the first through holes TH1 are formed through the buffer layer, the light absorbing layer and the back electrode layer. The first through holes TH1 may be formed such that portions of the support substrate 100 and the back electrode layer 200 are exposed.

Thus, a plurality of back electrodes may be formed on the support substrate, and the front electrode layer formed on the buffer layer may be electrically connected to the back electrode layer 200 exposed through the first through hole TH1.

The first through holes TH1 may be formed by using a mechanical apparatus such as a tip or a laser device, but the embodiment is not limited thereto.

The side insulating part 610 is formed on the side surface of the first through holes TH1. Preferably, the side insulating part 610 may be formed such that the side insulating part 610 makes direct contact with the side surfaces of the buffer layer 400, the light absorbing layer 300 and the back electrode layer which are exposed through the through hole TH1. Thus, the electrons of the front electrode layer 500 disposed on the buffer layer 400 may be prevented from moving into the light absorbing layer 300 or the back electrode layer 200, so that an amount of leakage current may be reduced.

The side insulating part 610 may be formed on the side surface of the first through hole TH1 through an inkjet scheme or by using a mask, but the embodiment is not limited thereto. Further, a material of the side insulating part 610 may be in the state of liquid, vapor or paste. Preferably, the side insulating part 610 may include a metallic oxide layer, an inorganic oxide layer or a polymer insulating layer. The side insulating layer 610 and the connecting member 600 may be sequentially formed. The side insulating part 610 may be formed between the connecting member and the side surfaces of the back electrode layer, the light absorbing layer and the buffer layer. Further, a width of the side insulating part 610 may be in the range of about 1 μm to 10 μm.

Referring to FIGS. 6 and 7, the front electrode layer 500 is formed by depositing a transparent conductive material on the buffer layer 400.

In addition, a transparent conductive material is deposited such that the transparent conductive material makes direct contact with the inner sides of the first through holes TH1, preferably, the side surface of the side insulating part 610 which makes direct contact with the inner sides of the first through holes TH1, thereby forming the connecting member 600.

The front electrode layer 500 and the connecting member 600 may be formed by depositing a transparent conductive material at an oxygen-free atmosphere. In more detail, the front electrode layer 500 may be formed by depositing AZO under the atmosphere of inert gas that does not include oxygen.

Referring to FIG. 7, portions of the light absorbing layer 300, the buffer layer 400 and the front electrode layer 500 are removed so that the second through holes TH2 are formed. Thus, the front electrode layer 500 is patterned such that a plurality of windows and a plurality of cells C1, C2, . . . are defined. A width of the second through holes TH2 may be in the range of about 80 μm to 200 μm, but the embodiment is not limited thereto.

As described above, the method of fabricating a solar cell according to the embodiment provides a solar cell including the side insulating part 610 formed on the side surface of the first through hole TH1 or the side surface of the connecting member 600. Further, the method of fabricating a solar cell according to the embodiment may separate the back electrode layer 200 and connect the front electrode layer 500 and the back electrode layer 200 to each other through the first through hole TH1.

That is, different from the related art in which through holes TH1 for separating the back electrode layer 200 and through holes TH1 for connecting the front electrode layer 500 and the back electrode layer 200 to each other are separately formed, the embodiment can reduce a dead zone area which may not work as a solar cell Therefore, a method of fabricating a solar cell according to the embodiment may simplify a process so that process efficiency and process cost may be reduced. Further, the dead zone area may be reduced so that the efficiency of the solar cell may be improved. In addition, the back electrode layer and the front electrode layer may be short-circuited through the side insulating part, so that the amount of leakage current may be effectively reduced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although the embodiments have been mainly described until now, they are just exemplary and do not limit the present invention. Thus, those skilled in the art to which the present invention pertains will know that various modifications and applications which have not been exemplified may be carried out within a range which does not deviate from the essential characteristics of the embodiments. For example, the constituent elements described in detail in the exemplary embodiments can be modified to be carried out. Further, the differences related to such modifications and applications shall be construed to be included in the scope of the present invention specified in the attached claims.

The invention claimed is:

1. A solar cell comprising:
   a support substrate;
   a Molybdenum (Mo) back electrode layer on the support substrate;
   a light absorbing layer on the Molybdenum (Mo) back electrode layer;
   a buffer layer on the light absorbing layer;
   a first through hole formed through the buffer layer and through the light absorbing layer to the back electrode layer;
   a transparent layer having a transparent front electrode member and a transparent connecting member, the front electrode member provided on the buffer layer, the connecting member disposed in the first through hole, and the connecting member electrically connects the back electrode layer to the front electrode member, and the connecting member is formed of a same material as the front electrode member;
   a side insulating part disposed in the first through hole and on one of side surfaces of the connecting member, and an upper surface of the side insulating part and an upper surface of the buffer layer form a same surface,
   wherein the side insulating part makes direct contact with a side surface of the buffer layer, the back electrode layer and the light absorbing layer,
   wherein the front electrode member and the connecting member are integrally formed with each other, and
   wherein a resistance of the side insulating part is higher than a resistance of the connecting member; and
   a second through hole provided through the buffer layer and through the light absorbing layer, and wherein the back electrode layer is continuously provided at a bottom of the second through hole, wherein a width of the first through hole is within a range of 80 μm to 200 μm, and a width of the side insulating part is within a range of 1 μm to 10 μm.

2. The solar cell of claim 1, wherein the side insulating part makes direct contact with the back electrode layer, the light absorbing layer and the side surface of the buffer layer which are exposed through the first through hole.

3. The solar cell of claim 1, wherein the side insulating part is formed between a side surface of the connecting member and side surfaces of the back electrode layer, the light absorbing layer and the buffer layer.

4. The solar cell of claim 1, wherein the side insulating part has a width in a range of 1 μm to 10 μm and a height of the side insulating part is same as a height of the first through hole.

5. The solar cell of claim 1, wherein a width of the second through hole is within a range of 80 μm to 200 μm.

* * * * *